United States Patent
Chang

(10) Patent No.: US 7,586,188 B2
(45) Date of Patent: Sep. 8, 2009

(54) CHIP PACKAGE AND CORELESS PACKAGE SUBSTRATE THEREOF

(75) Inventor: Wen-Yuan Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 301 days.

(21) Appl. No.: 11/466,851

(22) Filed: Aug. 24, 2006

(65) Prior Publication Data

US 2007/0132072 A1    Jun. 14, 2007

(30) Foreign Application Priority Data

Dec. 13, 2005  (TW) .................. 94144010 A

(51) Int. Cl.
*H01L 23/00* (2006.01)
*H01L 23/58* (2006.01)

(52) U.S. Cl. .............. 257/703; 257/684; 257/724; 257/729; 257/773; 257/776; 257/778; 257/E23.009; 257/E23.011; 257/E23.067; 257/E23.069

(58) Field of Classification Search ......... 257/666–733, 257/778–796, E23.001–E23.194, 773–776, 257/E21.505
See application file for complete search history.

(56) References Cited

U.S. PATENT DOCUMENTS

| 5,357,672 | A  | * | 10/1994 | Newman ................. 29/830 |
| 7,042,077 | B2 | * | 5/2006  | Walk et al. ............. 257/686 |
| 7,276,399 | B1 | * | 10/2007 | Hool et al. ............. 438/125 |
| 2005/0056942 | A1 | * | 3/2005 | Pogge et al. ........... 257/778 |

\* cited by examiner

*Primary Examiner*—Jasmine J Clark
(74) *Attorney, Agent, or Firm*—J.C. Patents

(57) ABSTRACT

A chip package includes a coreless package substrate and a chip. The coreless package substrate includes an interconnection structure and a ceramic stiffener. The interconnection structure has a first inner circuit, a carrying surface and a corresponding contact surface. The first inner circuit has multiple contact pads disposed on the contact surface. The ceramic stiffener is disposed on the carrying surface and has a first opening. In addition, the chip is disposed on the carrying surface and within the first opening and electrically connected to at least one of the contact pads.

16 Claims, 6 Drawing Sheets

CHIP PACKAGE AND CORELESS PACKAGE SUBSTRATE THEREOF

CROSS-REFERENCE TO RELATED APPLICATION

This application claims the priority benefit of Taiwan application serial no. 94144010, filed on Dec. 13, 2005. All disclosure of the Taiwan application is incorporated herein by reference.

BACKGROUND OF THE INVENTION

1. Field of the Invention

The present invention relates to a semiconductor device and a carrier thereof, and more particularly to a chip package and a coreless package substrate thereof.

2. Description of Related Art

In the semiconductor industry, an integrated circuit (IC) is fabricated through three phases including an IC design, an IC process and an IC packaging. In the IC process, a chip is fabricated by forming ICs on the wafer and then dicing the wafer. A wafer has an active surface, which generally refers to a surface having active devices thereon. After forming the ICs on the wafer, a plurality of bonding pads are disposed on the active surface of the chip and the chip finally made by dicing the wafer can be electrically connected to an external carrier via the bonding pads. While the chip is connected to a carrier by using wire bonding or flip chip bonding, the bonding pads of the chip can be electrically connected to the contacts of the carrier to form a chip package. The carrier can be, for example, a leadframe or a package substrate.

In a flip chip bonding technology, prior to dicing the wafer a plurality of bumps are usually formed on the bonding pads on the wafer active surface such that the chip can be electrically connected to an external substrate. The bumps are usually arranged in an area array on the chip active surface so that a chip package with high contact count and high contact density can be obtained, such as the flip chip/ball grid array package broadly used in the semiconductor packaging field. Unlike the wire bonding, the bumps in a flip chip bonding provide shorter transmission paths between the chip and the carrier to effectively promote the electrical performance of a chip package.

FIG. 1 is a schematic cross-sectional view of a conventional flip chip package. Referring to FIG. 1, a conventional flip chip package 100 includes a substrate 110, a chip 120, a plurality of solder bumps 130, an underfill 140 and a plurality of solder balls 150. The substrate 110 includes an interconnection structure 112, which has an inner circuit 112a, a carrying surface 112b and a contact surface 112c, wherein the inner circuit 112a has a plurality of contact pads 112d disposed on the contact surface 112c. In addition, the chip 120 is disposed on the carrying surface 112b and electrically connected to the contact pads 112d through the solder bumps 130 and the inner circuit 112a. The underfill 140 is disposed between the chip 120 and the substrate 110 and encapsulates the solder bumps 130. The underfill 140 is used for protecting the solder bumps 130 and playing a buffering role to reduce a thermal strain mismatch in manufacturing processes. The solder balls 150 are disposed on the contact pads 112d respectively for being electrically connected to the next level electronic devices, such as a printed circuit board (PCB) (not shown in FIG. 1).

The interconnection structure 112 includes a dielectric core layer 112e, a plurality of plating through holes (PTHs) 112f, a plurality of organic dielectric layers 112g, a plurality of conductive vias 112h and a plurality of wiring layers 112i. The plating through holes (PTHs) 12f pass through the dielectric core layer 112e and each conductive via 112h passes through one of the organic dielectric layers 112g. Besides, two wiring layers 112i are electrically connected to each other through at least one plating through hole (PTH) 112f or through at least one conductive via 112h. Thus, the plating through holes (PTHs) 112f, the conductive vias 112h and the wiring layers 112i form the above-described inner circuit 112a. In the conventional flip chip package however, the pitch of the plating through holes (PTHs) 112f is hard to be reduced, which becomes a major bottleneck while the layout density of the substrate 110 is increased.

SUMMARY OF THE INVENTION

In accordance with the present invention, a chip package including a coreless package substrate and a chip is provided. The coreless package substrate includes an interconnection structure and a ceramic stiffener. The interconnection structure has a first inner circuit, a carrying surface and a corresponding contact surface. The first inner circuit further includes a plurality of contact pads disposed on the contact surface. The ceramic stiffener is disposed on the carrying surface and has a first opening. Besides, the chip is disposed on the carrying surface and within the first opening and is electrically connected to at least one contact pad.

In accordance with the present invention, a coreless package substrate suitable for carrying and being electrically connected to a chip is provided. The coreless package substrate includes an interconnection structure and a ceramic stiffener. The interconnection structure has a first inner circuit, a carrying surface and a corresponding contact surface. The first inner circuit further includes a plurality of contact pads disposed on the contact surface. The ceramic stiffener is disposed on the carrying surface and has a first opening. The chip is suitable for being disposed on the carrying surface and within the first opening and is electrically connected to at least one contact pad.

According to an aspect of the present invention, because the ceramic stiffener in the coreless package substrate of the present invention has substantially higher strength compared to the conventional metal stiffener, during the process of fabricating the coreless package substrate the ceramic stiffener is unlikely to warp and also capable of reducing the residual stress in the coreless package substrate, and thereby promote the co-planarity of the coreless package substrate. Moreover, since the coreless package substrate of the present invention does not have any plating through hole (PTH), the wiring density of the coreless package substrate is increased. In addition, since the ceramic stiffener in the coreless package substrate of the present invention has a second opening or a second inner circuit, electronic components can be disposed in the second opening or on the ceramic stiffener for further increasing the disposition area of the electronic components.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
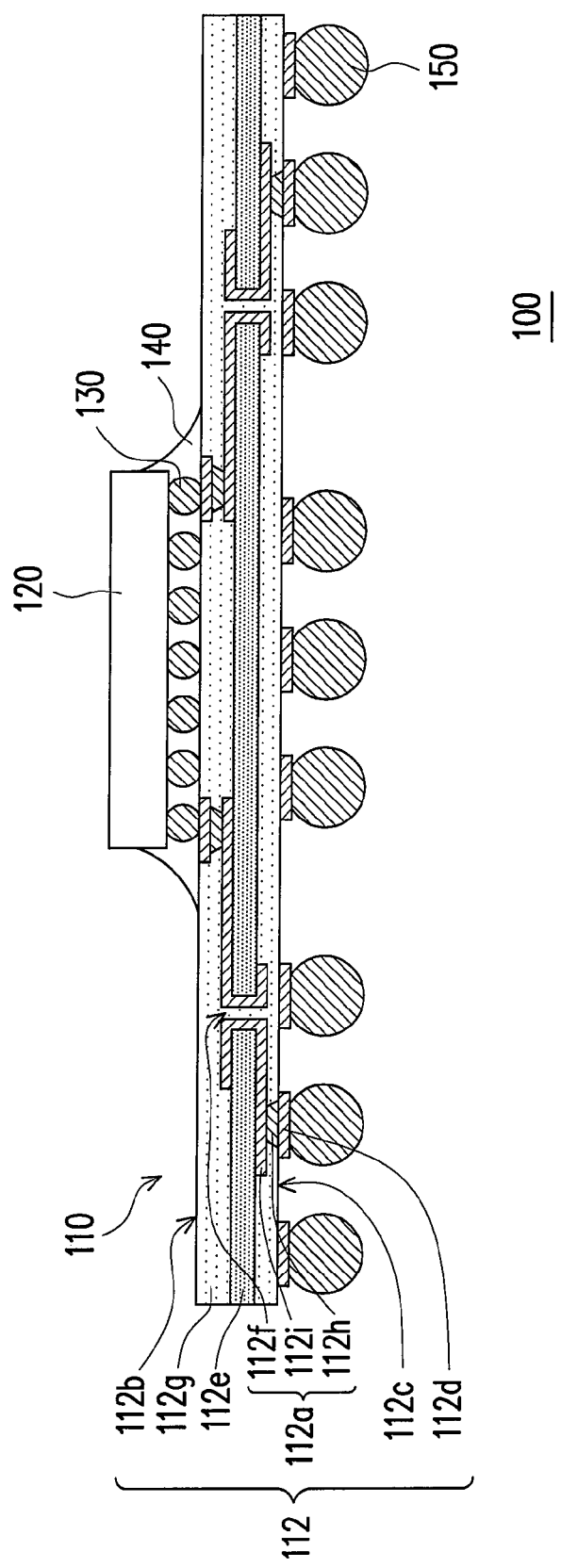
FIG. 1 is a schematic cross-sectional view of a conventional flip chip package.
Figure 2A:
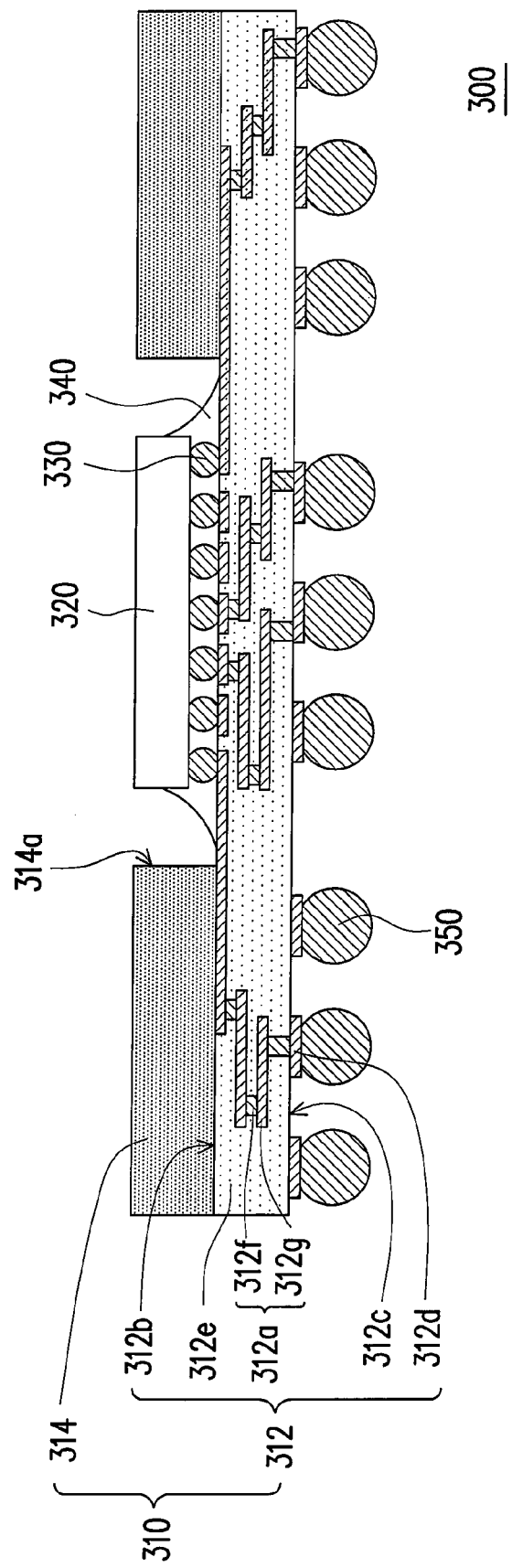
FIG. 2A is a schematic cross-sectional view of a chip package according to the first embodiment of the present invention.
Figure 2B:
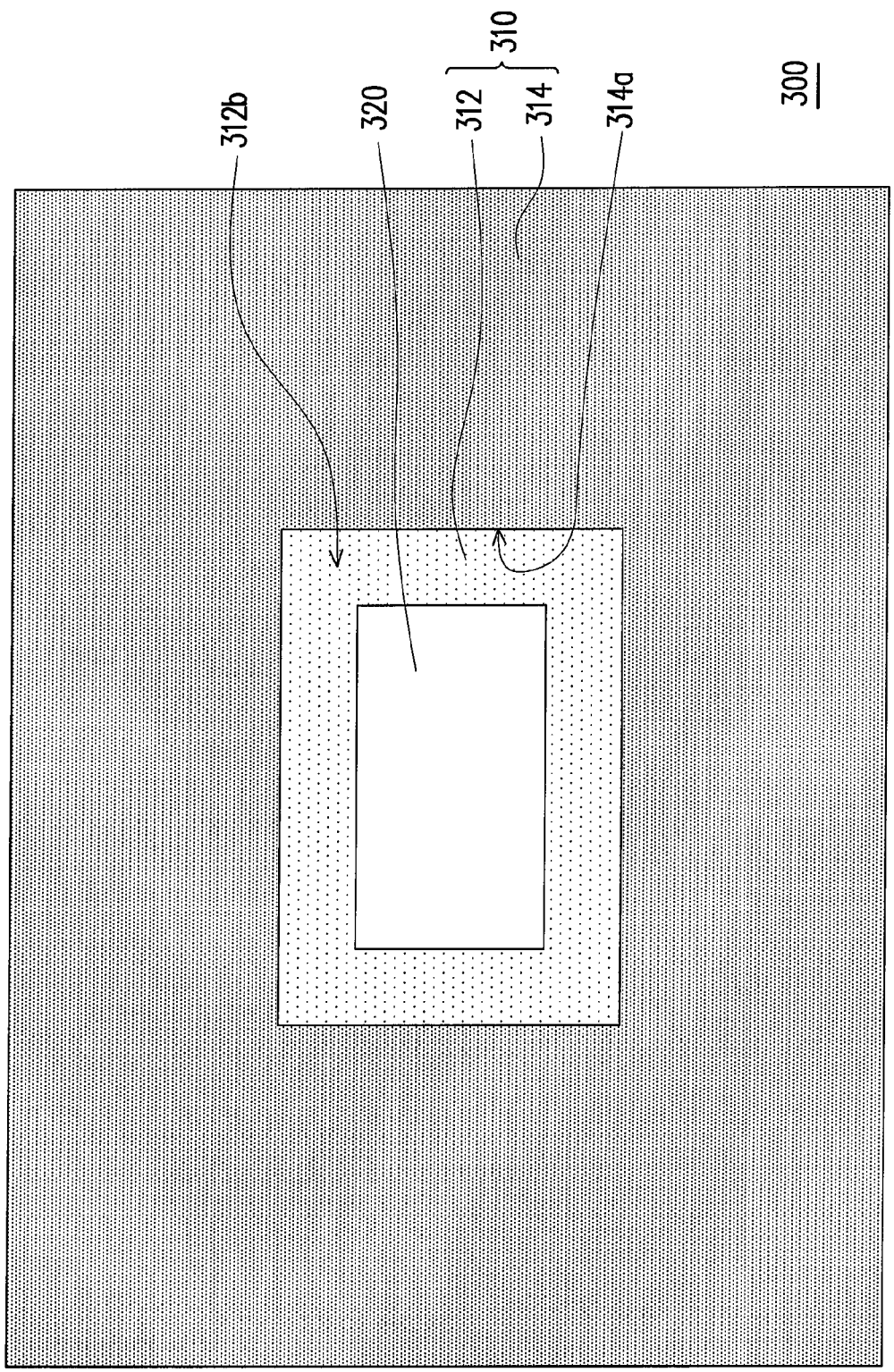
FIG. 2B is a schematic top view of the chip package in FIG. 2A.

FIG. 2A is a schematic cross-sectional view of a chip package according to the first embodiment of the present invention, while FIG. 2B is a schematic top view of the chip package in FIG. 2A. Referring to FIGS. 2A and 2B, a chip package 300 of the first embodiment includes a coreless package substrate 310 and a chip 320. The coreless package substrate 310 includes an interconnection structure 312 and a ceramic stiffener 314. The interconnection structure 312 has a first inner circuit 312a, a carrying surface 312b and a corresponding contact surface 312c. The first inner circuit 312a has a plurality of contact pads 312d disposed on the contact surface 312c. The ceramic stiffener 314 is disposed on the carrying surface 312b and has a first opening 314a. Besides, the chip 320 is disposed on the carrying surface 312b and within the first opening 314a and is electrically connected to at least one of the contact pads 312d. In the first embodiment, the first opening 314a herein has a rectangular cross-section profile; however the first opening 314a may also have any other cross section profile.

Referring to FIG. 2A, the chip package 300 further includes, for example, a plurality of bumps 330, an underfill 340 and a plurality of electrical contacts 350. The bumps 330 are disposed between the chip 320 and the interconnection structure 312, while the chip 320 is electrically connected to the first inner circuit 312a via the bumps 330. The material of the bumps 330 is, for example, solder. The underfill 340 is disposed between the chip 320 and the coreless package substrate 310 encapsulating the bumps 330. The underfill 340 is used for protecting the bumps 330 and playing a buffering role to reduce a thermal strain mismatch caused by the warmed up coreless package substrate 310 and chip 320. It is clear from the above described that the chip 320 in the first embodiment is electrically connected to the interconnection structure 312 through the bumps 330. In another embodiment however, the chip 320 is structurally and electrically connected to the interconnection structure 312 through an anisotropic conductive film (ACF).

In the first embodiment, the electrical contacts 350 are, for example, conductive balls disposed on the contact pads 312d respectively for being electrically connected to the next level electronic devices, for example, a printed circuit board (PCB) (not shown in FIG. 2A). Depending on the design requirement, the electrical contacts 350 can also be, for example, conductive pins or conductive columns. It should be noted that if a plurality of electrical contacts 350 are not disposed on the contact pads 312d respectively, the contact pads 312d can serve as an interface in land grid array (LGA) mode for signal access. If the electrical contacts 350 are conductive balls, the contacts 350 can serve as an interface in ball grid array (BGA) mode for signal access; if the electrical contacts 350 are conductive pins, the contacts 350 can serve as an interface in pin grid array (PGA) mode for signal access; and if the electrical contacts 350 are conductive columns, the contacts 350 can serve as an interface in column grid array (CGA) mode for signal access.

Referring to FIG. 2A, the interconnection structure 312 includes a plurality of dielectric layers 312e, a plurality of conductive vias 312f and a plurality of wiring layers 312g. The material of the dielectric layers 312e is, for example, BT (Bismaleimide-Triazine), Ajinomoto build-up film (ABF) or epoxy resin. Each conductive vias 312f (may be made of copper) would pass through one of the dielectric layers 312e. In addition, the wiring layers 312g and the dielectric layers 312e are alternately disposed, the wiring layers 312g and the conductive vias 312f together form a first inner circuit 312a and two wiring layers 312g are electrically connected to each other through at least one of the conductive vias 312f. The coreless package substrate 310 is fabricated by forming an interconnection structure 312 by using build-up processing on the lower surface of a ceramic plate (not shown in FIG. 2A) first, followed by forming a first opening 314a passing through the ceramic plate to complete the fabrication of the ceramic stiffener 314.

Figure 3A:
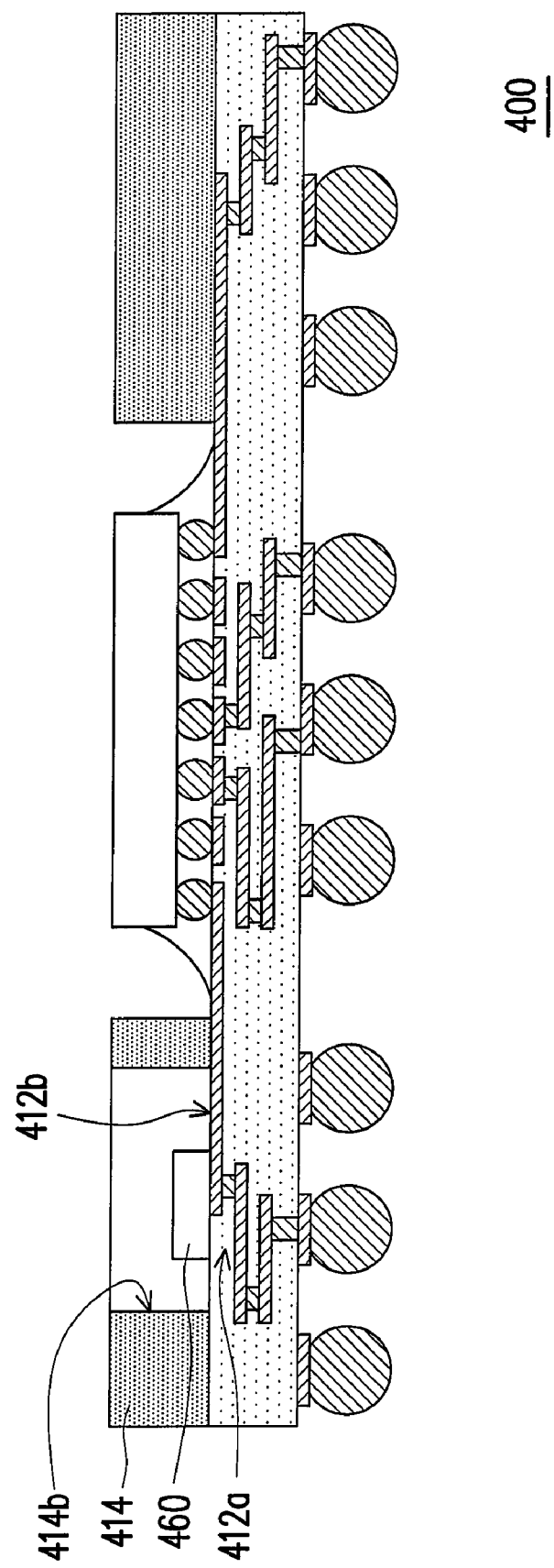
FIG. 3A is a schematic cross-sectional view of a chip package according to the second embodiment of the present invention.
Figure 3B:
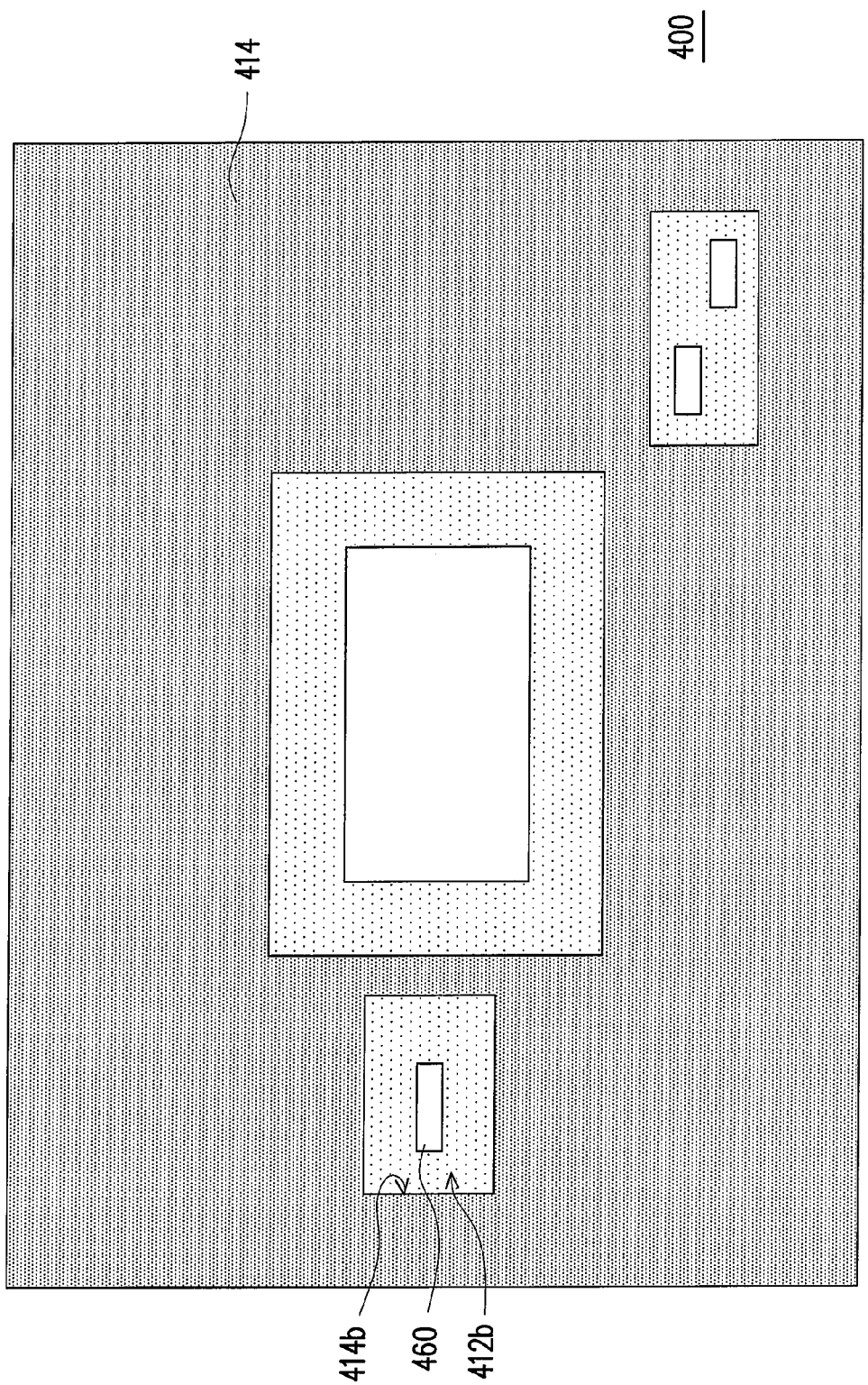
FIG. 3B is a schematic top view of the chip package in FIG. 3A.

FIG. 3A is a schematic cross-sectional view of a chip package according to the second embodiment of the present invention, while FIG. 3B is a schematic top view of the chip package in FIG. 3A. Referring to FIGS. 3A and 3B, the second embodiment is similar to the first embodiment except for the ceramic stiffener 414 of the chip package 400 includes at least a second opening 414b (in FIG. 3B, two second openings are shown) where at least an electronic component 460 is disposed (in FIG. 3B, three electronic components are shown) and the electronic components 460 are electrically connected to the first inner circuit 412a. The electronic components 460 are disposed on the carrying surface 412b by using, for example, surface mount technology and the electronic components 460 can be passive components, such as capacitors, inductors or resistors, IC components, or IC chips. The second opening 414b in the second embodiment has a rectangular cross-section profile, however the second opening 414b may also have any other cross section profile depending on the design requirement.

Figure 4:
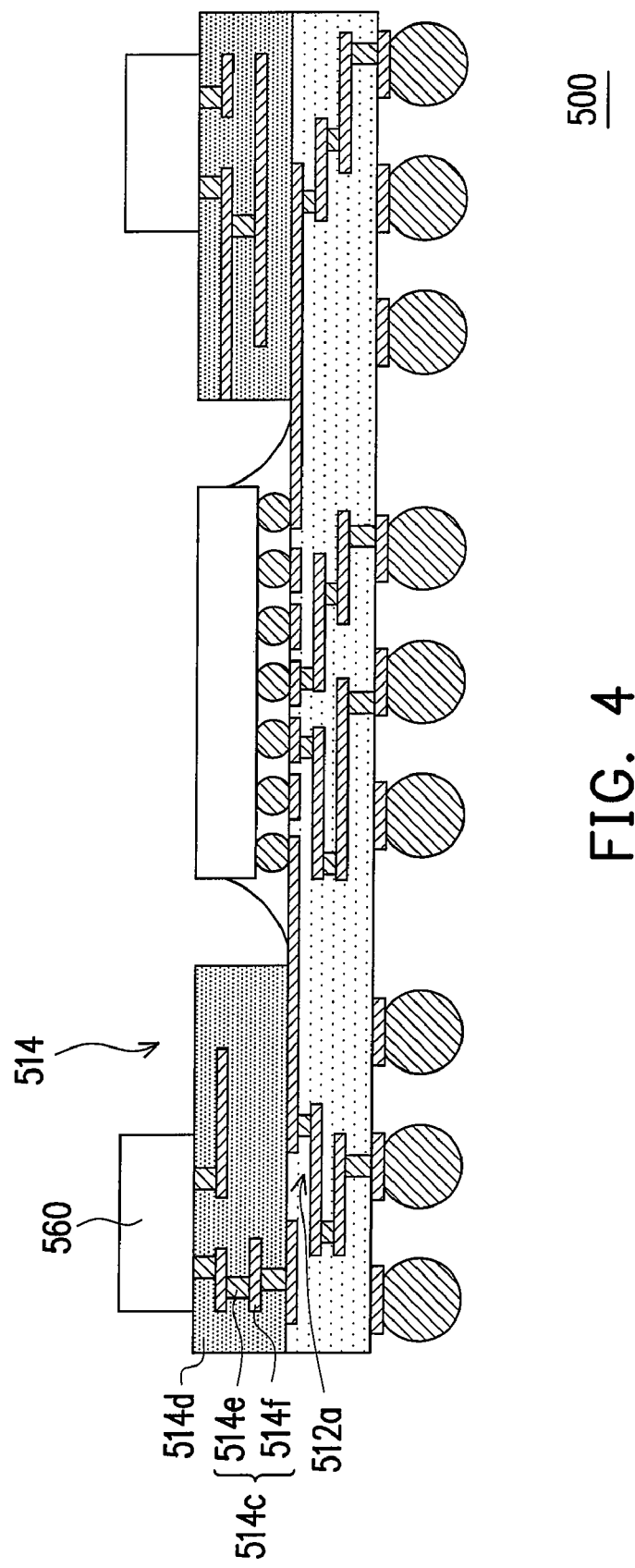
FIG. 4 is a schematic cross-sectional view of a chip package according to the third embodiment of the present invention.

FIG. 4 is a schematic cross-sectional view of a chip package according to the third embodiment of the present invention. Referring to FIG. 4, the third embodiment is similar to the first embodiment except for the ceramic stiffener 314 in the chip package 300 of the first embodiment is a single ceramic layer only, while the ceramic stiffener 514 in the chip package 500 of the third embodiment includes a plurality of ceramic dielectric layers 514d, a plurality of conductive vias 514e and a plurality of wiring layers 514f. Each conductive via 514e passes through one of the ceramic dielectric layers 514d. In addition, the wiring layers 514f and the ceramic dielectric layers 514d are alternately disposed, and the wiring layers 514f and the ceramic dielectric layers together form a second inner circuit 514c. Two wiring layers 514f are electrically connected to each other through at least one of the conductive vias. Wherein, at least an electronic component 560 is disposed on the ceramic stiffener 514 by using, for example, surface mounted technology and electrically connected to the second inner circuit 514c. The electronic components 560 can be passive components, such as capacitors, inductors or resistors, IC components, or IC chips.

It should be noted that in the third embodiment the second inner circuit 514c and the first inner circuit 512a are electrically connected to each other, alternatively the second inner circuit 514c and the first inner circuit 512a need not be electrically connected to each other depending on a design requirement. The second embodiment and the third embodiment may be combined depending on a design requirement (not shown herein).

In sum, the chip package and the coreless package substrate thereof of the present invention have at least the following advantages:

(1) Compared with a metal stiffener, the ceramic stiffener in the coreless package substrate of the present invention has a better stiffness, and therefore the ceramic stiffener provides a stress against the warp and has a reduced residual stress during the fabricating process for coreless package substrate to contribute to good co-planarity of the coreless package substrate.

(2) Due to the absence of plating through hole (PTH) on the coreless package substrate of the present invention, a high wiring density coreless package substrate can be obtained.

(3) Since the ceramic stiffener in the coreless package substrate of the present invention has a second opening or a second inner circuit, the electronic components can be disposed within the second opening or on the ceramic stiffener to further increase the disposition area of the electronic components.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chip package, comprising:
   a coreless package substrate, comprising:
   an interconnection structure, having a first inner circuit, a carrying surface and a corresponding contact surface, wherein the first inner circuit has a plurality of contact pads disposed on the contact surface; and
   a ceramic stiffener, disposed on the carrying surface and having a first opening, comprising:
      a plurality of ceramic dielectric layers;
      a plurality of conductive vias, wherein each conductive via passes through one of the ceramic dielectric layers; and
      a plurality of wiring layers, disposed alternately with the ceramic dielectric layers, wherein the wiring layers and the conductive vias together form the second inner circuit and two wiring layers are electrically connected to each other through at least one of the conductive vias; and
   a chip, disposed on the carrying surface and within the first opening and electrically connected to at least one of the contact pads, wherein the interconnection structure comprises:
   a plurality of dielectric layers;
   a plurality of conductive vias, wherein each conductive via passes through one of the dielectric layers; and
   a plurality of wiring layers, disposed alternately with the dielectric layers, wherein the wiring layers and the conductive vias together form the first inner circuit and two wiring layers are electrically connected to each other through at least one of the conductive vias.

2. The chip package as recited in claim 1, further comprising a plurality of bumps disposed between the chip and the interconnection structure, wherein the chip and the first inner circuit are electrically connected to each other through the bumps.

3. The chip package as recited in claim 1, wherein the ceramic stiffener comprises at least a second opening.

4. The chip package as recited in claim 3, wherein at least an electronic component is disposed within the second opening and the electronic component is electrically connected to the first inner circuit.

5. The chip package as recited in claim 4, wherein the electronic component comprises passive components.

6. The chip package as recited in claim 4, wherein the electronic component comprises IC (integrated circuit) components or IC (integrated circuit) chips.

7. The chip package as recited in claim 1, wherein at least an electronic component is disposed on the ceramic stiffener and the electronic component and the second inner circuit are electrically connected to each other.

8. The chip package as recited in claim 7, wherein the electronic component comprises passive components.

9. The chip package as recited in claim 7, wherein the electronic component comprises IC (integrated circuit) components or IC (integrated circuit) chips.

10. A coreless package substrate, suitable for carrying and being electrically connected to at least a chip; the coreless package substrate comprising:
    an interconnection structure having a first inner circuit, a carrying surface and a corresponding contact surface, wherein the first inner circuit has a plurality of contact pads disposed on the contact surface; and
    a ceramic stiffener, disposed on the carrying surface and having a first opening, comprising:
       a plurality of ceramic dielectric layers;
       a plurality of conductive vias, wherein each conductive via passes through one of the ceramic dielectric layers; and
       a plurality of wiring layers, disposed alternately with the ceramic dielectric layers, wherein the wiring layers and the conductive vias together form the second inner circuit and two wiring layers are electrically connected to each other through at least one of the conductive vias,
    wherein the chip is suitable for being disposed on the carrying surface and located within the first opening, and the chip is electrically connected to at least one of the contact pads, wherein the interconnection structure comprises:
    a plurality of dielectric layers;
    a plurality of conductive vias, wherein each conductive via passes through one of the dielectric layers; and
    a plurality of wiring layers, disposed alternately with the dielectric layers, wherein the wiring layers and the conductive vias together form the first inner circuit and two wiring layers are electrically connected to each other through at least one of the conductive vias.

11. The coreless package substrate as recited in claim 10, wherein the ceramic stiffener comprises at least a second opening.

12. The coreless package substrate as recited in claim 11, wherein at least an electronic component is disposed within the second opening and the electronic component is electrically connected to the first inner circuit.

13. The coreless package substrate as recited in claim 12, wherein the electronic component comprises passive components.

14. The coreless package substrate as recited in claim 12, wherein the electronic component comprises IC (integrated circuit) components.

15. The coreless package substrate as recited in claim 1, wherein at least an electronic component is disposed on the ceramic stiffener and the electronic component is electrically connected to the second inner circuit.

16. The coreless package substrate as recited in claim 15, wherein the electronic component comprises passive components, IC (integrated circuit) components or IC (integrated circuit) chips.

* * * * *